United States Patent [19]

Gregory

[11] 3,857,993

[45] Dec. 31, 1974

[54] BEAM LEAD SEMICONDUCTOR PACKAGE

[75] Inventor: Philip L. Gregory, Los Altos, Calif.

[73] Assignee: Raytheon Company, Lexington, Mass.

[22] Filed: Nov. 21, 1973

[21] Appl. No.: 418,018

[52] U.S. Cl. .............. 174/52 S, 29/589, 174/50.61, 357/74

[51] Int. Cl. .............................................. H05k 5/00

[58] Field of Search .............. 174/52 S, 50.61, 50.6, 174/50.63; 317/234 G, 234 J; 29/628, 588–590

[56] References Cited

UNITED STATES PATENTS 3,239,596 3/1966 Henderson......................... 174/52 S 3,405,442 10/1968 Caracciolo................. 317/234 G U 3,735,213 5/1973 Kansky ........................ 174/50.61 U

*Primary Examiner*—Darrell L. Clay

*Attorney, Agent, or Firm*—Joseph D. Pannone; Milton D. Bartlett; David M. Warren

[57] ABSTRACT

A beam lead semiconductor package in which a plurality of leads are sealed through an aperture in the upper surface of a header by an insulating seal, with the ends of the leads being substantially coplanar with the upper surface of the header and a beam lead semiconductor device having at least one of the beams bonded to the upper surface of the header and a plurality of the other beams bonded to the leads whereby the beam lead device is rigidly supported with respect to the header and a cap is hermetically sealed over the header.

7 Claims, 2 Drawing Figures

PATENTED DEC 31 1974 3,857,993

BEAM LEAD SEMICONDUCTOR PACKAGE

BACKGROUND OF THE INVENTION

Beam lead devices in which a plurality of beams are formed on the surface of an epitaxial semiconductor layer containing one or more semiconductor devices and/or one or more passive elements are well known. Such beams are normally formed by plating and extend beyond the edge of the semiconductor chip so that a welding tool may be applied to the ends of the beams to weld such devices to corresponding leads formed on a substrate. Such a substrate, which has leads of approximately the same thickness as the beams, then forms contact points to which a lead frame or packaging leads may be attached by thermal compression bonding or other means. Such an interconnecting substrate has heretofore been necessary with beam lead devices to produce satisfactory junctions with a high degree of yield and reliability. This results from the fact that in production the beam lead devices with leads attached are relatively fragile until the leads are rigidly attached to a substrate or base.

SUMMARY OF THE INVENTION

In accordance with this invention, a package header is used as the interconnecting substrate so that the beam lead device may be welded directly to contacts on the substrate.

Because the spacing and dimensions of the beams is extremely small, on the order of thousandths of an inch, it is necessary that the leads be accurately positioned. In accordance with this invention, a metal header is formed with an aperture in the upper surface, and a plurality of leads are positioned extending through the aperture. The spacing of the leads in the aperture is chosen by the spacing between adjacent beams to which connections are to be made, while the spacing of the leads at the bottom of the header is determined by the dimensions of the socket to which the leads are to be introduced as pins. Thus, the leads may be bent or formed to match the different dimensions between the adjacent beams and the adjacent socket pins below the upper surface of the header. The upper dimension of the pins' spacing may be controlled accurately, for example, by forming two adjacent pins of a common piece of wire with a U-shaped top piece temporarily interconnecting the tops of the pins. Since this U-shaped piece is an integral portion of the original wire, it may be accurately formed, for example, in a forming machine. Glass powder is then used to fill the header surrounding the leads, with the U-shaped portion extending through the header aperture, and the header is passed through a furnace to fuse the glass to the leads and the header. Preferably, the header is upside down during the fusing process in a jig which accurately positions the U-shaped portion of the lead with respect to the sides of the apertures and a jig which accurately positions the leads extending outwardly from the header. Conventional glass powder in automatic high temperature sealing machines in an inert atmosphere may be used. The glass extends upwardly through the header so that the entire region of the aperture is filled with insulating material surrounding the leads.

The upper surface of the header is now made coplanar by removing the U-shaped portion of the leads, removing any oxides or compounds which would interfere with the subsequent lapping process by conventional etching techniques, lapping the surface smooth so that the ends of the leads and the surface of the header are coplanar, and thoroughly removing any of the abrasive material used in the lapping process. Since most of the parts, namely, the lead material, glass powder and header material, are conventional for existing semiconductor headers, the device may be made extremely inexpensively utilizing existing machinery.

A beam lead semiconductor device is then attached to the coplanar surface of the header by bonding the ends of the beam leads, with each adjacent beam lead being connected to a different lead end in the header aperture and at least one of the beam leads being connected to the header surface. If there are additional beams not used for other functions, they may be also bonded to the header surface. Thus, the beam leads are supported directly by the coplanar solid surface, and the resulting device has all the characteristics of conventional beam lead structures with respect to rigidity, vibration, shock resistance, and thermal heat dissipation. Since it provides a very short thermal path from the semiconductor device through the beam leads to the substantial heat sink of the header, it has a better thermal dissipation characteristic than conventional beam lead package structures. A metal cap is then hermetically welded to the header in an inert atmosphere so that the resultant device is a hermetically sealed metallic envelope containing the semiconductor device.

BRIEF DESCRIPTION OF THE DRAWINGS

Other and further objects and advantages of this invention will be apparent as the description thereof progresses, reference being had to the accompanying drawings wherein.

DESCRIPTION OF THE PREFERRED EMBODIMENT OF THE INVENTION

Figure 1:
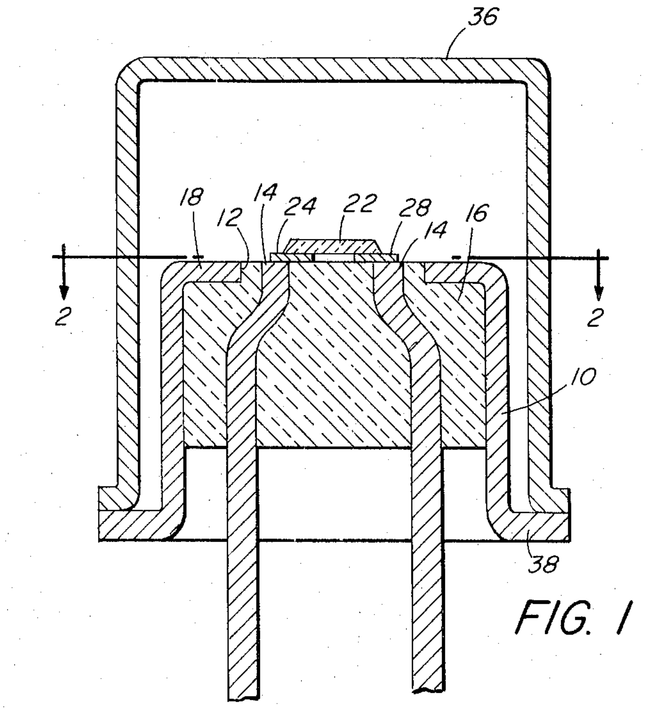
FIG. 1 illustrates a vertical sectional view of a package embodying the invention taken along line 1—1 of FIG. 2.
Figure 2:
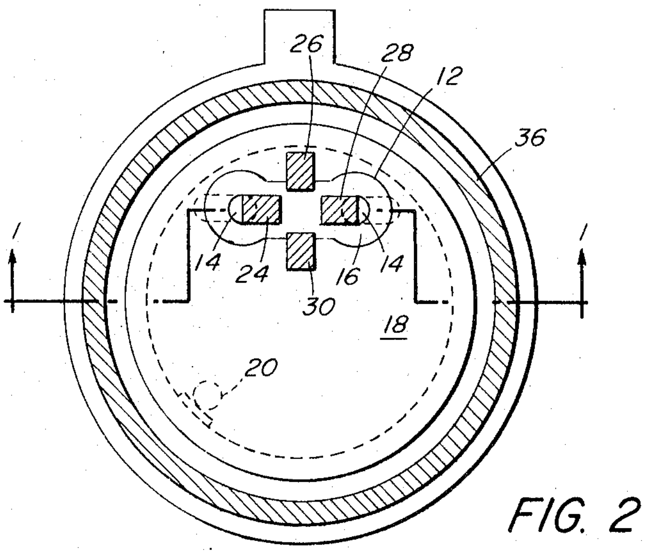
FIG. 2 illustrates a transverse sectional view of the device of FIG. 1 taken along line 2—2 of FIG. 1.

Referring now to FIG. 1, there is shown a semiconductor header 10 of metal such as standard Kovar (an alloy of iron, nickel, and cobalt) having an aperture 12 in the upper surface thereof. The aperture 12 as shown comprises two circles approximately 40 mils in diameter (one mil equals one thousandth of an inch), the edges of said circles being substantially tangent and portions of the metal on either side of the tangency region being removed to form a channel approximately 20 mils wide. However, any desired shape of aperture can be used, dependent upon the shape and location of the beam lead device to be attached to the header.

Positioned at the center of each of the circles are leads 14, shown here by way of example as 19-mil diameter wire (conventional lead diameter). Leads 14 are embedded in an insulating body of glass 16 which extends to the surface 18 of the header 10 and is coplanar with the ends of the leads 14.

The body of glass 16 is preferably bonded to the interior of the header 10 and to the leads 14 by means of any conventional bonding layer (not shown) such as an oxide, in accordance with well-known practice. The leads 14 also have bends in them within the glass body 16 so that when the leads extend from the bottom of the header, their spacings are determined by the pin spacing of the socket for which the package is designed, and their upper ends are spaced accurately from each other and from the metal aperture walls of the metal header portion of surface 18 to which at least one of the beam leads is to be bonded. Spacing of leads 14 from each other is determined by the location of the beam leads on the semiconductor chip to which the leads 14 are to be bonded. An additional lead or leads 20 are attached directly to the header, for example by welding. Lead 20 is formed, if desired, to be held in the glass body 16 in a position providing the desired pin spacing from leads 14 at the lower end of the header for the socket. For example, the device illustrated herein is for a TO-18 package and pin spacing.

A semiconductor chip 22 has a plurality of beam leads 24, 26, 28, and 30 formed thereon, on the order of one-half mil thick, which contact one or more circuit elements on the chip. While, as shown here, the device is a discrete transistor having a collector, emitter and base, any desired combination of active and/or passive elements can be attached to beams in accordance with well-known practice, and any desired number of leads may be formed in one or more apertures 12 in the header 10. The beam leads are preferably bonded to the leads 14 and the header surface 18 by welding with relatively low temperature and pressure which is sufficient to deform the leads. In order to insure reliability, preferably the beams are sufficiently long that a plurality of welds may be made between each of the beams and its respective lead or header surface region.

A cap 36 is then welded to the header skirt 38 of the header 10 to form a hermetically sealed unit, preferably this operation being carried out in an inert atmosphere so that the interior of the package containing the semiconductor chip 22 is not subject throughout its life to variation in operating characteristics by reason of interaction with the surrounding atmosphere.

The foregoing structure may be formed automatically with high-speed machinery and, hence, can be formed very inexpensively, for example for a few cents, thereby producing a package for beam lead structures which also, in discrete form, may be formed for a few cents (several thousand of such structures being generally obtainable from each wafer of a semiconductor material passing through the production line).

In addition, such a structure may have the chip bonded to the header with automatic machinery so that the entire process is reduced in cost to a bare minimum. Thus, the cost of packaging of beam lead devices, which has heretofore been substantially greater than that of the packaging of conventional devices, may be reduced to less than the cost of many conventional packaging systems. As a result, the advantages of beam lead devices, such as high resistance to vibration, high reliability of the contacts and high heat dissipation via the beam leads, become competitive with conventional semiconductor structures.

DESCRIPTION OF THE PREFERRED PROCESS

Header 10 is positioned upside down in a jig (not shown) formed, for example, of stainless steel or any other material which will not substantially react at temperatures of 700° or 800°C. Positioned in header 10 is a U-shaped piece of wire comprising the leads 12 whose lower ends extend beyond the surface 18 of the header and are connected together by a U-shaped section so that the leads 12 can be formed on a continuous basis from a reel or wire by a forming machine to form U-shaped portions having the desired bends therein. Preferably, the header and wire portions are loaded automatically in the jig, and glass powder is positioned in the header substantially filling the header 10. A spacing jig is positioned over the leads 12 and 20 extending upwardly from the header so that these pin spacings will be accurately maintained.

All of the metal parts of the assembly have preferably been oxidized by conventional means such as heating in an oxidizing atmosphere to form a layer of oxide thereon. This layer upon heating acts with the glass, in accordance with well-known practice, to form a bond through the oxide between the glass and the metal. The assembly is passed through an oven in an inert atmosphere at a temperature on the order of 700° to 1,000°C, the precise temperature used being dependent upon the time which the device is in the oven. For example, at a temperature of 750°, the device need be in the oven for several minutes. However, at 1,000°, the device need be in the oven for only a minute or less. It should be clearly understood that this portion of the bonding process is conventional, and any desired atmosphere, presurface preparing of the metal parts and/or insulating material in powder form or preform could be used. For example, it is clearly to be understood that if the glass is sintered to form a preform, such a preform can be used as the upper jig spacer. Under these conditions, however, the glass should not be heated sufficiently to allow the leads to move with respect to each other but should rather be heated into the sintering range for a sufficient length of time to close any of the pores between the particles of glass to form a hermetically sealed structure. The header is then allowed to cool and the U-shaped member connecting leads 14 is sheared off.

The entire assembly is now bright dipped by subjecting it to an etch which removes the oxide layer on the surface of the Kovar parts. While this bright dip removes edges of the metal and makes depressions around the peripheries of the ends of leads 14 and the edges of aperture 12, this has been found to be non-deleterious due to subsequent processing. Any desired oxide removing etch may be used for the purpose.

The surface 18 is then lapped to remove a thickness in the range of one to five mils, and preferably approximately 2 to 3 mils, to form a smooth surface in which the ends of the leads which are also dressed by the lapping operation are substantially coplanar with the surface 18, and the surface of the insulating material from the glass 16 is substantially coplanar with surface 18. The aforementioned etchant depressions in surface 18 are substantially removed by such lapping. Any residual lapping compound is then rinsed off from surface 18.

The beam lead chip 22 is now positioned on the header which has been positioned in a welding machine. Such a welding machine may be, for exmaple, of the type disclosed in U.S. Pat. No. 3,747,829 issued July 24, 1973 to Lucien A. Hofmeister. The bonding tool of the machine is designed to fit over the chip, which preferably has sloped sides lying in the [111] crystallographic plane formed by preferentially etching the sides of the chip during the separation process in accordance with U.S. Pat. No. 3,486,892 issued Dec.

30, 1969 to Warren C. Rosvold. In such a chip, the surface supporting the beam leads 24, 26, 28, and 30 lies in the [100] crystallographic plane of the single crystal silicon semiconductor device 22. The tool is then wobbled to contact one or more beams at a time and welding pressure and current applied sequentially between each of the beams 22 through 28 and the lead ends 14 and/or surface 18. Preferably, at least two wobble revolutions of the bonding tool with different axes or tilts of the tool are used to produce bonds in at least the two locations for each of the beam leads. Such bonding occurs, for example, at a temperature of around 450°, with a pressure sufficient to slightly deform the predominantly gold beam leads in the weld regions.

If desired, the surface 18 and the ends of the leads 14 may have a gold coating applied thereto of one or more mils thickness after removing the lapping compound The header cap 36 is then positioned over the header, in an inert atmosphere such as nitrogen, and welded to the header in accordance with well-known practice.

This completes the description of the beam lead device package and the process of forming the same. However, many modifications thereof will be apprent to persons skilled in the art without departing from the spirit and scope of this invention. For example, materials other than Kovar could be used for the header and leads, and the leads could extend at angles other than at right angles to the beams and could be formed in other configurations than those shown. Also, the header size, while illustrated herein as the TO-18 package dimensions, could be any of the TO series of packages or any other package. Accordingly, it is contemplated that this invention be not limited by the particular details of the embodiments illustrated herein, except as defined by the appended claims.

What is claimed is:

1. A semiconductor device package comprising:

a metal header structure having a surface with an aperture therein; and a plurality of leads supported in said aperture and insulated from said structure with one end of each of said leads being substantially coplanar with said surface, wherein said header structure supports a semiconductor device haing a plurality of beam leads extending outwardly therefrom, the outwardly extending ends of said beam leads being bonded respectively to each of said lead ends and to said surface.

2. The package in accordance with claim 1 wherein a cover is bonded to said header structure enclosing said beam lead semiconductor device.

3. The package in accordance with claim 2 wherein the edges of said semiconductor device lie substantially in the crystallographic plane.

4. The package in accordance with claim 3 wherein said leads and said header are formed substantially of an alloy of iron, nickel, and cobalt.

5. The method of forming a seminconductor beam lead package assembly comprising the steps of:

forming a cup-shaped header with an aperture in a wall thereof;

forming an assembly comprising at least one conductive lead in said cup-shaped header extending into said aperture and bonded to and insulated from said header through an insulating body forming a planar surface of said header and an end of said lead supporting a semiconductor device having a plurality of beam leads extending outwardly therefrom on said surface, with different ones of said beam leads of said device respectively connected to the ends of said leads and said header surface.

6. The method in accordance with claim 5 wherein said step of forming said assembly includes the step of forming said insulating body from glass powder.

7. The method in accordance with claim 6 further including the step of forming said header and lead-in members are formed of the same metallic material.

* * * * *